United States Patent
Joshi et al.

(10) Patent No.: US 12,166,480 B2
(45) Date of Patent: Dec. 10, 2024

(54) DATA MULTIPLEXER SINGLE PHASE FLIP-FLOP

(71) Applicant: Intel Corporation, Santa Clara, CA (US)

(72) Inventors: Chinmay Joshi, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 670 days.

(21) Appl. No.: 17/346,034

(22) Filed: Jun. 11, 2021

(65) Prior Publication Data

US 2022/0399893 A1    Dec. 15, 2022

(51) Int. Cl.
| | |
|---|---|
| *H03K 3/356* | (2006.01) |
| *H03K 3/3562* | (2006.01) |
| *H03K 19/0185* | (2006.01) |
| *H03K 19/173* | (2006.01) |
| *H03K 19/21* | (2006.01) |

(52) U.S. Cl.
CPC ... *H03K 19/01855* (2013.01); *H03K 3/35625* (2013.01); *H03K 19/1737* (2013.01); *H03K 19/215* (2013.01)

(58) Field of Classification Search
CPC ......... H03K 3/35625; H03K 19/01855; H03K 19/1737; H03K 19/215
See application file for complete search history.

(56) References Cited

U.S. PATENT DOCUMENTS

| | | | | |
|---|---|---|---|---|
| 5,886,541 | A | * | 3/1999 | Asato ............... H03K 3/356113 326/98 |
| 9,755,618 | B1 | * | 9/2017 | Rasouli ............ H03K 3/356104 |
| 2003/0079167 | A1 | * | 4/2003 | Koe .................... G11B 20/1816 |
| 2017/0063349 | A1 | * | 3/2017 | Kim ....................... H03K 3/037 |

OTHER PUBLICATIONS

Ji-Ren et al., "A true single-phase-clock dynamic CMOS circuit technique," IEEE Journal of Solid-State Circuits ( vol. 22, Issue: 5, Oct. 1987), pp. 899-901.

* cited by examiner

*Primary Examiner* — Kurtis R Bahr
(74) *Attorney, Agent, or Firm* — NICHOLSON DE VOS WEBSTER & ELLIOTT LLP

(57) ABSTRACT

A single-phase clocked data multiplexer (MUX-D) scan capable flipflop (FF) design that improves over existing transmission-gate (t-gate) based master-slave flipflops in terms of dynamic capacitance (Cdyn) as well as performance while remaining comparable in area. Unique features of the design are a complementary metal oxide semiconductor (non-t-gate) style structure with an improvement in circuit parameters achieved by eliminating clock inversions and maximally sharing NMOS devices across NAND structures. The core of the flipflop adopts an all CMOS NAND, And-OR-Inverter (AOI) complex logic structure to implement a true edge-triggered flip-flop functionality.

20 Claims, 7 Drawing Sheets

DATA MULTIPLEXER SINGLE PHASE FLIP-FLOP

BACKGROUND

A D-Flipflop (DFF) is a fundamental sequential element in digital logic design. With modern high-performance designs being dominated by clock power, improving Power Performance Area (PPA) for a flipflop is very useful for product performance.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
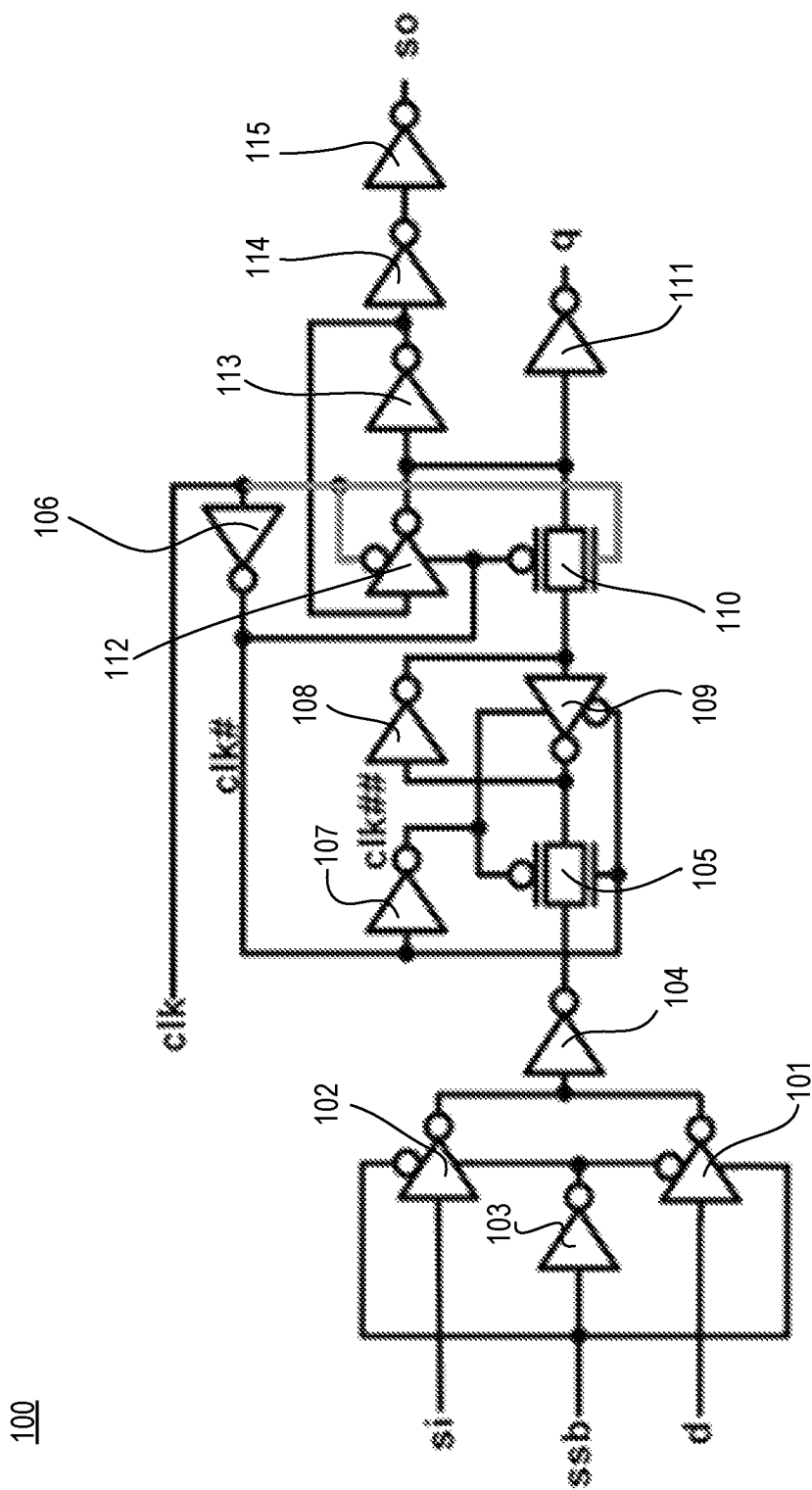
FIG. 1 illustrates a data multiplexer (MUX-D) scan capable flipflop (FF).

PPA for a flipflop can be improved by reducing dynamic power (Cdyn)—colloquially internal power plus clock power, reducing sequential overhead "Black Hole Time" (BHT) that is setup plus clk-to-q, or by reducing area. Some embodiments describe a single-phase clocked data multiplexer (MUX-D) scan capable flipflop (FF) design that improves over existing transmission-gate (t-gate) based master-slave flipflops in terms of Cdyn as well as performance while remaining comparable in area. Unique features of the design are a complementary metal oxide semiconductor (non-t-gate) style structure with an improvement in circuit parameters achieved by eliminating clock inversions and maximally sharing n-type device(s) (e.g., NMOS device (s)) across NAND structures. The core of the flipflop solution abandons the traditional master-slave flipflop topology with t-gates, inverters and keeper devices and adopts an all CMOS NAND, And-OR-Inverter (AOI) complex logic structure to implement a true edge-triggered flip-flop functionality. A MUX-D style scan is implemented into the front-end of the structure with traditional CMOS gates. The MUX-D FF of various embodiments leverages CMOS gates throughout the structure which allows the solution to minimize poly-breaks caused in N-P boundary issue in t-gate solutions (classical 2-Cpp poly cross-couple construct). In some embodiments, the MUX-D FF has fewer inverters (e.g., one to none) and relies on combinatorial NAND structures and the usage of single-phase of clock (without needing any inversions).

There are many technical effects of the various embodiments. For example, the single-phase clocked MUX-D scan capable FF improves PPA for power and performance vectors. Various embodiments achieve these improvements while retaining scan functionality, which is embedded into the front-end of the structure. The MUX-D design of various embodiments has advantages like all true single-phase clocked designs of not having exposure to the falling edge of the clock, as long as a certain minimum high-pulse width is met. When compared with existing Mux-D flipflops, the MUX-D FF of various embodiments improves BHT by, for example, 8% at iso power. With resizing to emphasize Cdyn, proposed flipflop consumes less power (e.g., 7% less power at iso speed (BHT)). In one example, it is estimated that there is a total of 80 million flipflops in a server processor. Contribution from flipflops is roughly 30% for total power of the chip. Therefore, with 7% less power, an estimate of nearly 2.1% power reduction at product level is realized with the MUX-D FF topology of various embodiments. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates a data multiplexer (MUX-D) scan capable flipflop (FF) 100. FF 100 comprises tri-stateable inverters 101, 102, inverters 103 and 104, pass-gate 105, clock inverters 106 and 107, memory element comprising inverter 108 and tristate inverter 109, pass-gate 110, output inverter 111, memory element comprising tristate inverter 112 and inverter 113, and inverters 114 and 115 coupled as shown. FF 100 receives scan input Si, scan control ssb, data input d, and clock Clk. FF 100 outputs data output q and scan output so. Here, clk# is an inverse of clk and clk## is an inverse of clk#. Throughout the document, node names and signal names are interchangeably used. For the term "clk" may refer to node clk or clock signal clk depending on the context of the sentence. Pass-gates 105 and 110 are also referred to as transmission gates (or t-gates). The incoming clock clk is inverted to generate both polarities of the clock phase for usage within flipflop 100. There are in total 3 nodes toggling at clock rate. Classically, clock devices remain as low threshold-voltage (LVT) high leakage devices with the rest of the devices switched to lower leakage in higher threshold-voltage variants of the structure. FF 100 shows an explicit scan-out pin, however, actual implementations would allow the use of the "q" output to be the scan-out, i.e. the double inversion on "so" may be redundant. Here, "so" pin is explicit shown to highlight the fact that a scan-chain would use a de-racer (min-delay protection) which is implicitly achieved by the explicit "so" inverters. Alternate structures without explicit scan-out would add inverters on "si" pin to achieve the same. The addition of logic for scan as shown increase power and area, and are not suitable for low power and high-speed designs where there is a desire to provide 99% or more scan coverage.

Figure 2:
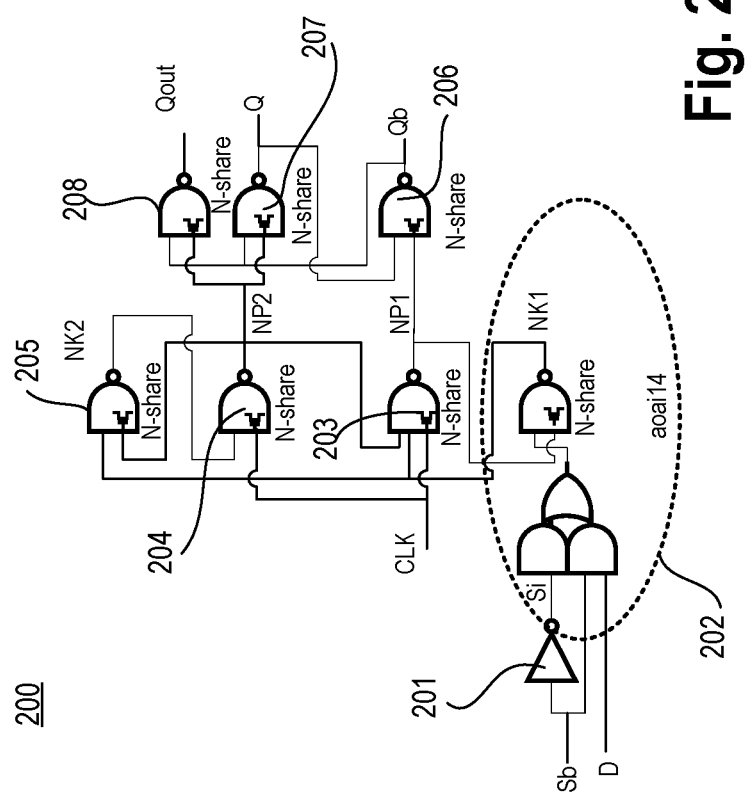
FIG. 2 illustrates a fast MUX-D single phase FF, in accordance with some embodiments.

FIG. 2 illustrates fast MUX-D single phase FF 200, in accordance with some embodiments. FF 200 comprises inverter 201, complex logic gate 202 that provides And-Or-And-Invert (AOAI) function (also referred here as AOAI gate 202), and NAND gates 204, 205, 206, 207, and 208 coupled as shown. The includes are clock CLK, data D, and Scan input Sb. The output is Qout. Other possible outputs are Qb (inverted version of Qout or Q). The internal nodes are Si, NK1, NP1, NP2, and NK2. FF 200 is a single-phase clocked edge trigged FF.

In some embodiments, cross-coupled gates between NK1 and NP1 implement a "0" catcher set-reset (S-R) latch topology. Similarly, S-R latch between NK2 and NP2 implements a "0" catcher for the inversion of input. Note that AOAI gate 202 forms an embedded Mux-D for Si and D inputs and absorbs feedback from the NP1 node. Functionally, with CLK at logic-0 (Low), both SR latches are locked out with NP2 and NP1 being driven to logic-1 (High). Note, in this state nodes Q and Qb preserve previous values. An explicit NAND 208 drives the outgoing Q—it mimics NAND 207 driving Q—and is implemented primarily to isolate output from internal nodes of the structure, in accordance with some embodiments. In this state, nodes NK1 and NK2 logically are set to an inversion of input and the same logic value as input respectively. The fact that the input is logically reflected on NK1 and NK2 with NP1 and NP2 set High means that the S-R latches are primed to capture the value of input, in accordance with some embodiments. A high going CLK edge activates NP1 and NP2 NAND gates 203 and 204, respectively, to capture the value of NK2 and NK1. This in turn would flow through to Q and Qb (and the output) since NP2 and NP1 would be complementary logic values—since NK2 and NK1 were complementary previously.

Note that with the CLK High, changes in input D pin would not propagate to the output. Consider the case with D being Low initially NK1 would be high (and NK2 low). On a CLK High transition, NP1 goes Low and NP2 remains High. Low NP1 disables AOAI gate 202 and NK1 is no longer responsive to D. Consider the alternate case of D being High initially when CLK was Low. NK1 is Low and NK2 is High. With CLK going High NP1 remains High but NP2 being forced Low in this case. Notice that the feedback of NP2 to NP1 would keep NP1 to now remain High irrespective of the other inputs to NAND gate 203 driving NP1. This extra half-cross couple allows NP1 and NP2 to remain locked even when D transitions Low. In some embodiments, NK1 transitions High in this scenario but with NP2 being Low, this change in D does not propagate to NK2. The circuit of various embodiments implements a true flip-flop functionality and is responsive to the rising edge of clock.

Figure 6:
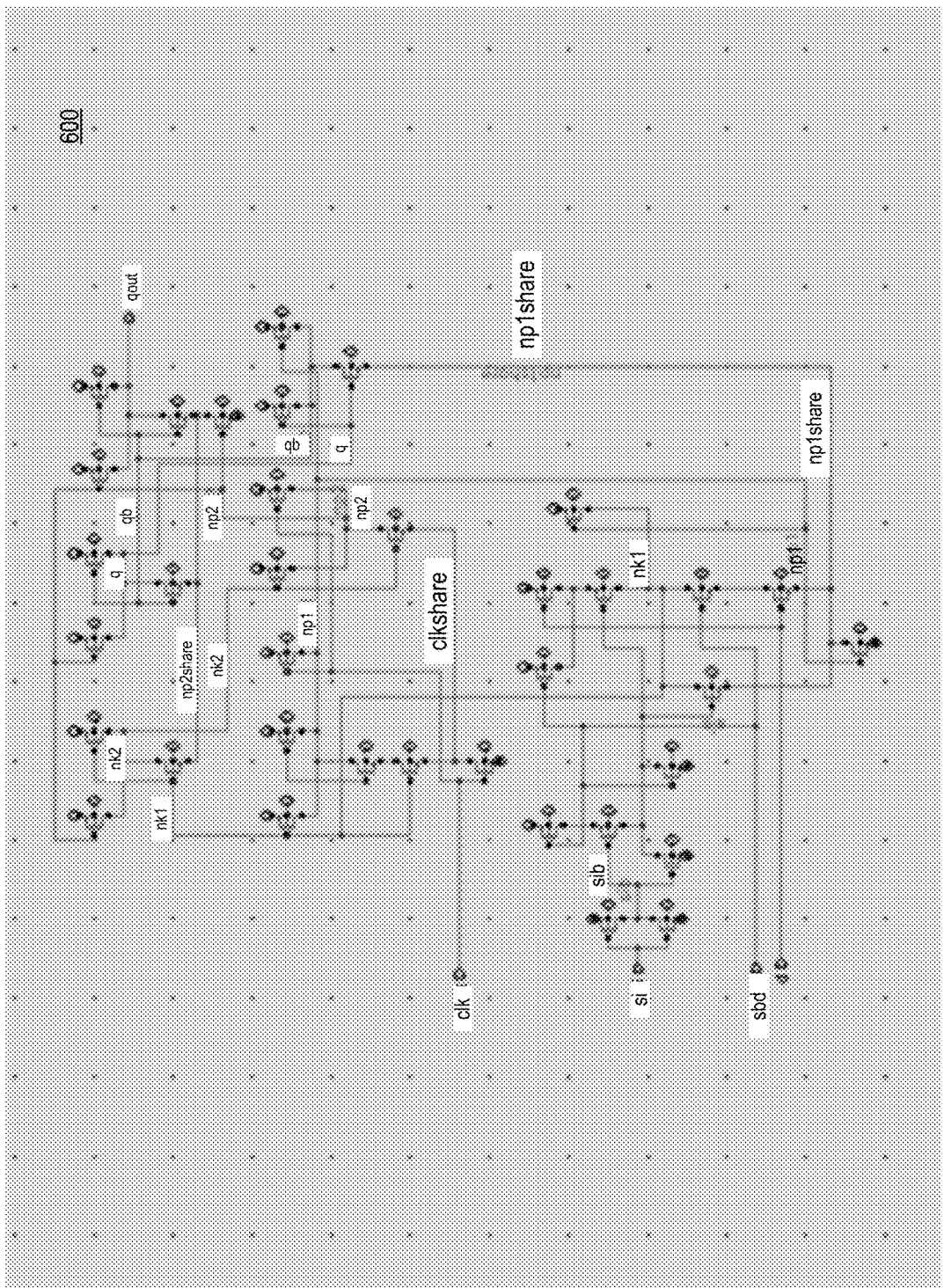
FIG. 6 illustrates a transistor-level schematic of a fast MUX-D single phase FF, in accordance with some embodiments.

Various symbols of NAND gates show an NMOS device to indicate that NMOS devices inside are actually shared across those logic gates. The detailed transistor interconnections is shown in FIG. 6. The NMOS devices across NAND gates e.g., NAND gate in AOAI 202, and NAND gates 203, 204, 205, 206, 207, and 208 are used to lower device count which in turn lowers gate-capacitance and reduces Cdyn, in accordance with various embodiments. For example, by sharing NMOS devices across the NAND gates (of FF 200) which carry complementary signals, a reduction in device-width is observed without any speed loss.

Clock power is one of the bigger sources of power consumptions and in flipflop 200 it is possible to reduce it by lowering gate capacitance for CLK input. NP1 and NP2 go to High together when clock switches Low. But with CLK going High, merely one of them will transition to Low depending upon D/NK1/NK2 polarities. Therefore, since NP1 and NP2 nodes do not need to be discharged simultaneously, sharing NMOS device that is connecting to CLK is possible without impacting speed of the operation, in accordance with some embodiments.

Even when data is not switching, NP1 and NP2 nodes will switch to High every time CLK goes to Low and one of them will keep toggling along with the clock depending upon polarity of D/NK1/NK2. Therefore, there is a motivation to share NMOS device where NP1 and NP2 are inputs, in accordance with some embodiments. In some embodiments, circuit functionality is such that both NK1 and Qb do not need to be discharged to Low simultaneously—which allows NMOS device sharing for NP1 net or node. And similarly, NK2 and Q do not transition Low together, allowing NMOS device sharing for NP2 net as well.

In some embodiments, FF 200 can be vectored as a vectored FF cell, which allows output Qout of FF 200 to be coupled to Si of the next FF 200. In some embodiments, the clock and scan enable (Sb) is shared among all FFs of the vectored FF cell.

Figure 3:
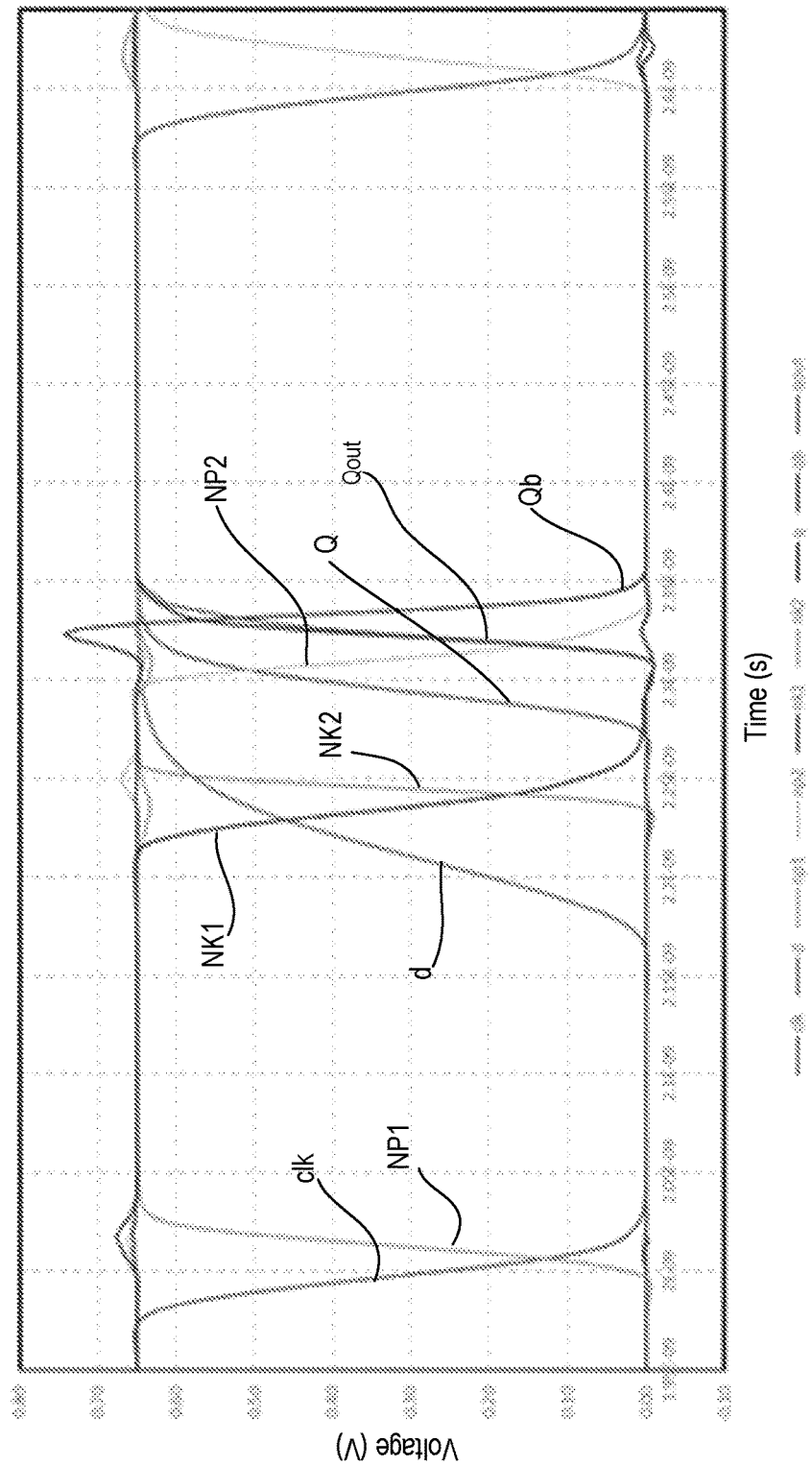
FIGS. 3-4 illustrate simulation waveforms of functional behavior of the fast MUX-D single phase FF, in accordance with some embodiments.
Figure 4:
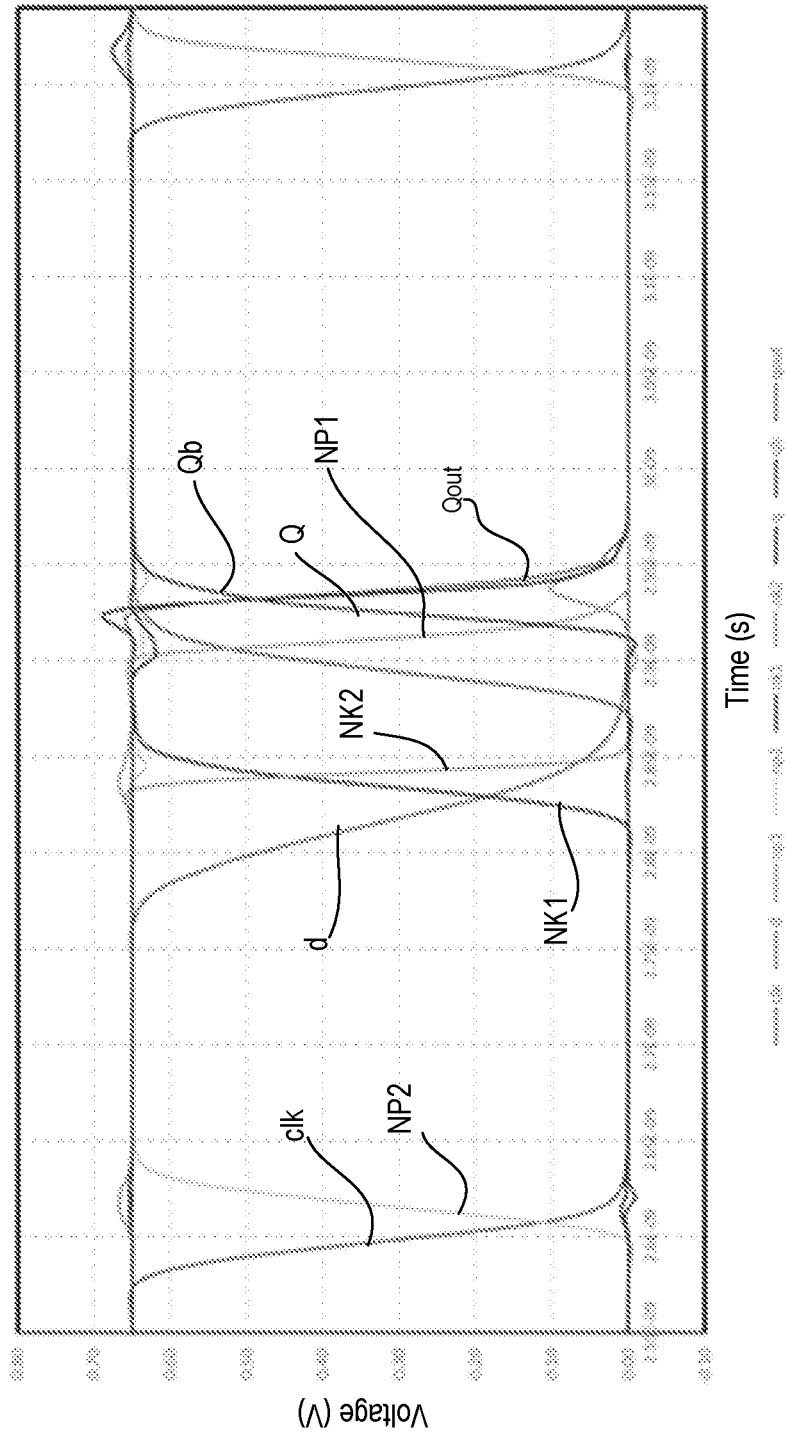

FIGS. 3-4 illustrate simulation waveforms 300 and 400 of functional behavior of the fast MUX-D single phase FF, in accordance with some embodiments. Set of waveforms 300 show the behavior when clock transition s from low to high (0→1). Set of waveforms 400 show the behavior when clock transition s from high to low (1→0).

Figure 5:
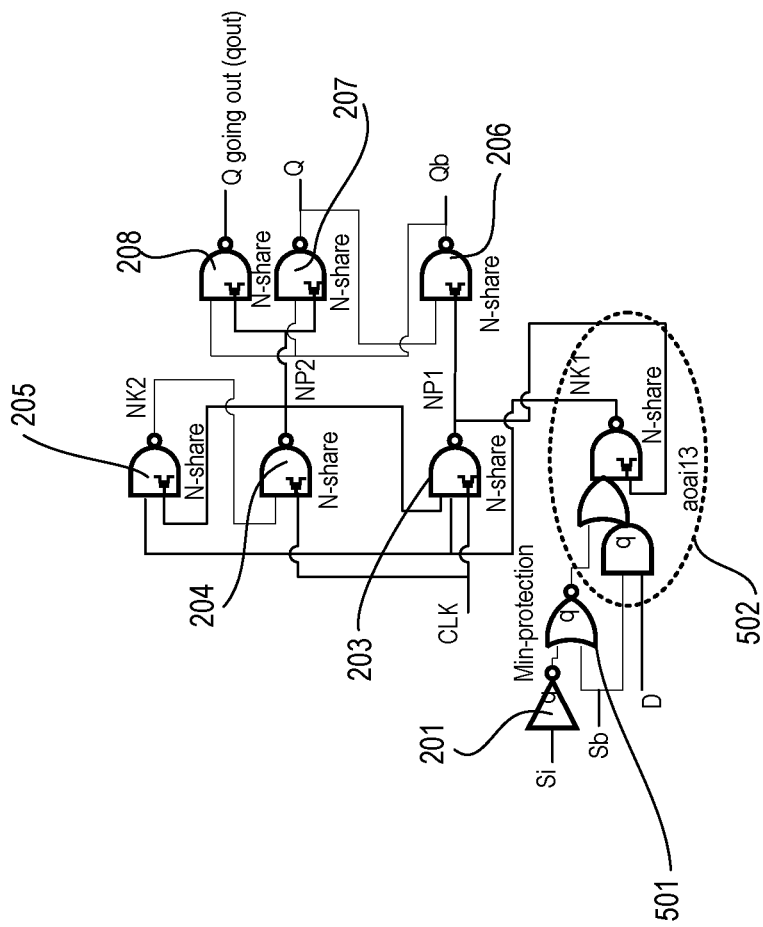
FIG. 5 illustrates a fast MUX-D single phase FF, in accordance with some embodiments.

FIG. 5 illustrates fast MUX-D single phase FF 500, in accordance with some embodiments. FF 500 is similar to FF 200 but for NOR gate 501 and complex gate 502. In FF 200, the scan-enable input "sb" would use both "sb" and its complement to implement the complete structure. In some cases, due to speed to Si and D, hold timing violations may occur. While simulations do-not indicate the need of a de-racer or minimum delay buffers between Q and Si pins, hold timing violations may still appear because both Si and D are equally fast in their interception with CLK. In some embodiments, FF 500 can be vectored as a vectored FF cell, which allows output Qout of FF 500 to be coupled to Si of the next FF 500. In some embodiments, the clock and scan enable (Sb) is shared among all FFs of the vectored FF cell.

FF 500 provides an alternative to the multiplexer portion of FF 200. In some embodiments, AND-OR-AND-INVERT complex gate 502 is used to capture D when Sb is high (non-scan) and in addition the cross-couple from NP1. Some embodiments use an explicit inverter-NOR combination (e.g., inverter 201 and NOR 501) to capture the Si input. Note that FF 500 allows us to use "Sb" as-is without needing any inversion. "Si" pin in this topology of FF 500 is much slower than the D pin—so there is a certain comfort of additional min-delay margining in the topology.

FIG. 6 illustrates a transistor-level schematic 600 of a fast MUX-D single phase FF 200, in accordance with some embodiments. clkshare, np1 share, and np2 share nets illustrate how NMOS device sharing is done for those nets. With CLK low, the holding S-R latch is configured in a way to create minimum NMOS device diffusion, which has exposure to a soft-error strike. Similarly, with CLK high, a similar situation prevails—since the CLK is fed to devices farthest away from the input. In general, FF 200 in schematic 600 incorporates the "reversed tri-state" type solution to enable good soft-error rate (SER) immunity.

While various embodiments are illustrated using NAND gates, a person skilled can use DeMorgan's theorem to generate an equivalent FF. For example, NAND gates can be replaced with NOR gates, AOAI 202 (or 502) can be replaced with OR-AND-OR-INVERT logic, and the polarity of the inputs can be changed. In some embodiments, 'Q' is not provided as a separate pin, but Qout is used as the output of the FF.

Figure 7:
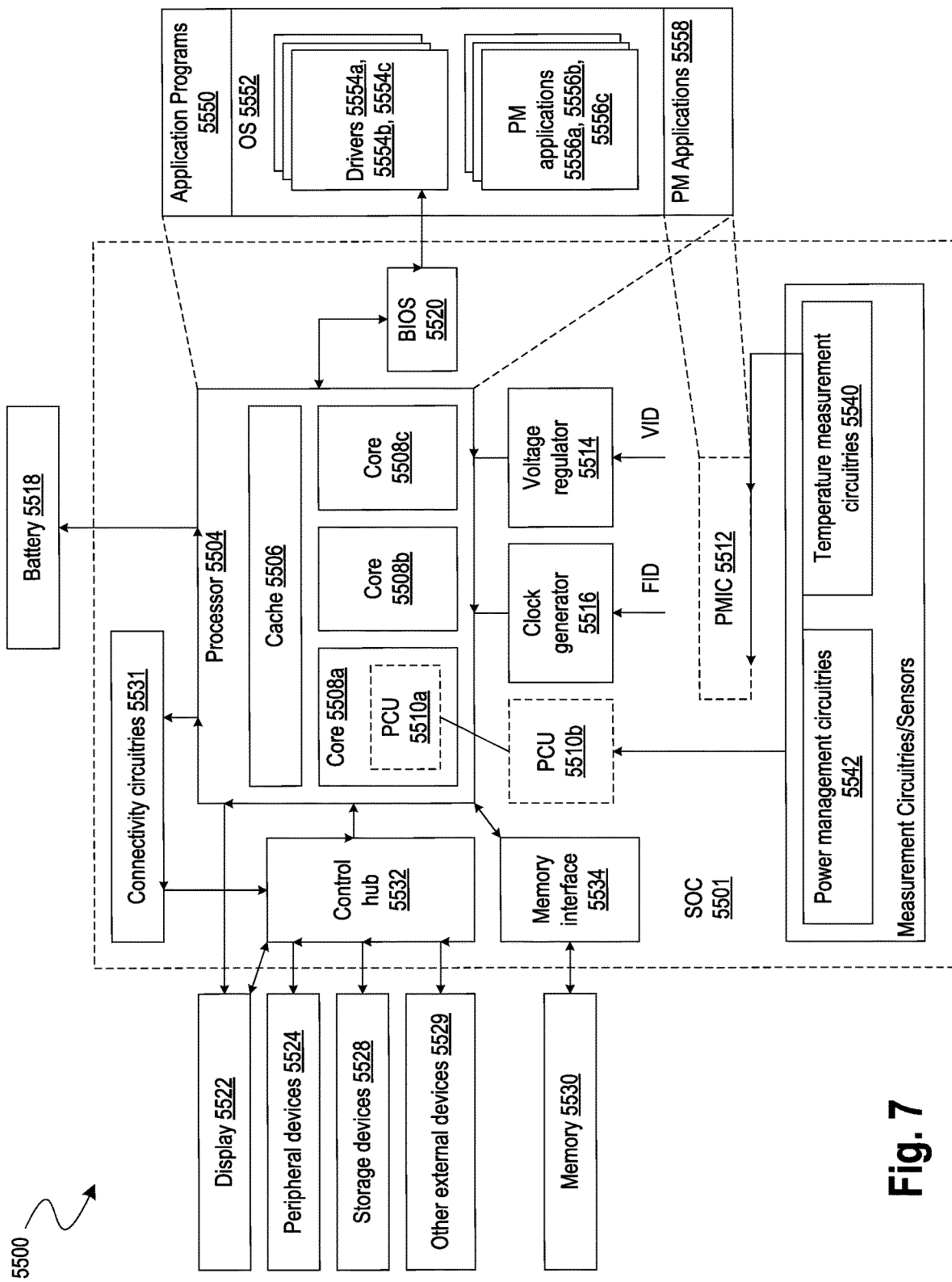
FIG. 7 illustrates a system-on-chip (SoC) with MUX-D single phase FF, in accordance with some embodiments.

FIG. 7 illustrates a system-on-chip (SoC) with MUX-D single phase FF, in accordance with some embodiments. It is pointed out that those elements of FIG. 7 having the same reference numbers (or names) as the elements of any other figure may operate or function in any manner similar to that described, but are not limited to such. In some embodiments, any of the blocks (e.g., processor cores) the MUX-D single phase FF.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 7, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing implementations such as disaggregated combinations of multiple compute, graphics, accelerator, I/O and/or other processing chips. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 7, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530)

may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adaptor.

In some embodiments, battery 5518 periodically checks an actual battery capacity or energy with charge to a preset voltage (e.g., 4.1 V). The battery then decides of the battery capacity or energy. If the capacity or energy is insufficient, then an apparatus in or associated with the battery slightly increases charging voltage to a point where the capacity is sufficient (e.g. from 4.1 V to 4.11 V). The process of periodically checking and slightly increase charging voltage is performed until charging voltage reaches specification limit (e.g., 4.2 V). The scheme described herein has benefits such as battery longevity can be extended, risk of insufficient energy reserve can be reduced, burst power can be used as long as possible, and/or even higher burst power can be used.

In some embodiments, battery 5518 is a multi-battery system with workload dependent load-sharing mechanism. The mechanism is an energy management system that operates in three modes—energy saving mode, balancer mode, and turbo mode. The energy saving mode is a normal mode where the multiple batteries (collectively shown as battery 5518) provide power to their own set of loads with least resistive dissipation. In balancing mode, the batteries are connected through switches operating in active mode so that the current shared is inversely proportion to the corresponding battery state-of-charge. In turbo mode, both batteries are connected in parallel through switches (e.g., on-switches) to provide maximum power to a processor or load. In some embodiments, battery 5518 is a hybrid battery which comprising a fast charging battery and a high energy density battery. Fast charging battery (FC) means a battery capable of faster charging than high energy density battery (HE). FC may be today's Li-ion battery as it is capable of faster charging than HE. In some embodiments, a controller (part of battery 5518) optimizes the sequence and charging rate for the hybrid battery to maximize both the charging current and charging speed of the battery, while enabling longer battery life.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package.

In various embodiments, each die (or dielet) includes a power management unit (PMU) or p-unit. For example, processor dies can have a supervisor p-unit, supervisee p-unit, or a dual role supervisor/supervisee p-unit. In some embodiments, an I/O die has its own dual role p-unit such as supervisor and/or supervisee p-unit. The p-units in each die can be instances of a generic p-unit. In one such example, all p-units have the same capability and circuits, but are configured (dynamically or statically) to take a role of a supervisor, supervisee, and/or both. In some embodiments, the p-units for compute dies are instances of a compute p-unit while p-units for IO dies are instances of an IO p-unit different from the compute p-unit. Depending on the role, p-unit acquires specific responsibilities to manage power of the multichip module and/or computing platform. While various p-units are described for dies in a multichip module or system-on-chip, a p-unit can also be part of an external device such as I/O device.

Here, the various p-units do not have to be the same. The HPM architecture can operate very different types of p-units. One common feature for the p-units is that they are expected to receive HPM messages and are expected to be able to comprehend them. In some embodiments, the p-unit of IO dies may be different than the p-unit of the compute dies. For example, the number of register instances of each class of register in the IO p-unit is different than those in the p-units of the compute dies. An IO die has the capability of being an HPM supervisor for CXL connected devices, but compute die may not need to have that capability. The IO and computes dice also have different firmware flows and possibly different firmware images. These are choices that an implementation can make. An HPM architecture can choose to have one superset firmware image and selectively execute flows that are relevant to the die type the firmware is associated with. Alternatively, there can be a customer firmware for each p-unit type; it can allow for more streamlined sizing of the firmware storage requirements for each p-unit type.

The p-unit in each die can be configured as a supervisor p-unit, supervisee p-unit or with a dual role of supervisor/supervisee. As such, p-units can perform roles of supervisor or supervisee for various domains. In various embodiments, each instance of p-unit is capable of autonomously managing local dedicated resources and contains structures to aggregate data and communicate between instances to enable shared resource management by the instance configured as the shared resource supervisor. A message and wire-based infrastructure is provided that can be duplicated and configured to facilitate management and flows between multiple p-units.

In some embodiments, power and thermal thresholds are communicated by a supervisor p-unit to supervisee p-units. For example, a supervisor p-unit learns of the workload (present and future) of each die, power measurements of each die, and other parameters (e.g., platform level power boundaries) and determines new power limits for each die. These power limits are then communicated by supervisor p-units to the supervisee p-units via one or more interconnects and fabrics. In some embodiments, a fabric indicates a group of fabrics and interconnect including a first fabric, a second fabric, and a fast response interconnect. In some embodiments, the first fabric is used for common communication between a supervisor p-unit and a supervisee p-unit. These common communications include change in voltage, frequency, and/or power state of a die which is planned based on a number of factors (e.g., future workload, user behavior, etc.). In some embodiments, the second fabric is used for higher priority communication between supervisor p-unit and supervisee p-unit. Example of higher priority communication include a message to throttle because of a possible thermal runaway condition, reliability issue, etc. In some embodiments, a fast response interconnect is used for communicating fast or hard throttle of all dies. In this case, a supervisor p-unit may send a fast throttle message to all other p-units, for example. In some embodiments, a fast response interconnect is a legacy interconnect whose function can be performed by the second fabric.

The HPM architecture of various embodiments enables scalability, modularity, and late binding of symmetric and/or asymmetric dies. Here, symmetric dies are dies of same size, type, and/or function, while asymmetric dies are dies of different size, type, and/or function. Hierarchical approach also allows PMU functions that may already exist on other dice to be leveraged, instead of being disabled in the traditional flat power management scheme. HPM does not assume a pre-determined mapping of physical partitions to domains. An HPM domain can be aligned with a function integrated inside a dielet, to a dielet boundary, to one or more dielets, to a companion die, or even a discrete CXL device. HPM enables management of any arbitrary collection of functions independent of their level of integration. In some embodiments, a p-unit is declared a supervisor p-unit based on one or more factors. These factors include memory size, physical constraints (e.g., number of pin-outs), and locations of sensors (e.g., temperature, power consumption, etc.) to determine physical limits of the processor.

The HPM architecture of various embodiments, provides a means to scale power management so that a single p-unit instance does not need to be aware of the entire processor. This enables power management at a smaller granularity and improves response times and effectiveness. Hierarchical structure maintains a monolithic view to the user. For example, at an operating system (OS) level, HPM architecture gives the OS a single PMU view even though the PMU is physically distributed in one or more supervisor-supervisee configurations.

In some embodiments, the HPM architecture is centralized where one supervisor controls all supervisees. In some embodiments, the HPM architecture is decentralized, wherein various p-units in various dies control overall power management by peer-to-peer communication. In some embodiments, the HPM architecture is distributed where there are different supervisors for different domains. One example of a distributed architecture is a tree-like architecture.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556a, 5556b, 5556c. The OS 5552 may also include various drivers 5554a, 5554b, 5554c, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, battery 5518 includes hybrid technologies. For example, a mix of high energy density charge (e.g., Li-ion batteries) carrying device(s) and low energy density charge carrying devices (e.g., supercapacitor) are used as batteries or storage devices. In some embodiments, a controller (e.g., hardware, software, or a combination of them) is used analyze peak power patterns and minimizes the impact to overall lifespan of high energy density charge carrying device-based battery cells while maximizing service time for peak power shaving feature. The controller may be part of battery 5518 or part of p-unit 5510b.

In some embodiments, pCode executing on PCU 5510a/b has a capability to enable extra compute and telemetries resources for the runtime support of the pCode. Here pCode refers to a firmware executed by PCU 5510a/b to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Some embodiments use three components to adjust the peak power of SoC 5501 based on the states of a USB TYPE-C device 5529. These components include OS Peak Power Manager (part of OS 5552), USB TYPE-C Connector Manager (part of OS 5552), and USB TYPE-C Protocol Device Driver (e.g., one of drivers 5554*a*, 5554*b*, 5554*c*). In some embodiments, the USB TYPE-C Connector Manager sends a synchronous request to the OS Peak Power Manager when a USB TYPE-C power sink device is attached or detached from SoC 5501, and the USB TYPE-C Protocol Device Driver sends a synchronous request to the Peak Power Manager when the power sink transitions device state. In some embodiments, the Peak Power Manager takes power budget from the CPU when the USB TYPE-C connector is attached to a power sink and is active (e.g., high power device state). In some embodiments, the Peak Power Manager gives back the power budget to the CPU for performance when the USB TYPE-C connector is either detached or the attached and power sink device is idle (lowest device state).

In some embodiments, logic is provided to dynamically pick the best operating processing core for BIOS power-up flows and sleep exit flows (e.g., S3, S4, and/or S5). The selection of the bootstrap processor (BSP) is moved to an early power-up time instead of a fixed hardware selection at any time. For maximum boot performance, the logic selects the fastest capable core as the BSP at an early power-up time. In addition, for maximum power saving, the logic selects the most power efficient core as the BSP. Processor or switching for selecting the BSP happens during the boot-up as well as power-up flows (e.g., S3, S4, and/or S5 flows).

In some embodiments, the memories herein are organized in multi-level memory architecture and their performance is governed by a decentralized scheme. The decentralized scheme includes p-unit 5510 and memory controllers. In some embodiments, the scheme dynamically balances a number of parameters such as power, thermals, cost, latency and performance for memory levels that are progressively further away from the processor in platform 5500 based on how applications are using memory levels that are further away from processor cores. In some examples, the decision making for the state of the far memory (FM) is decentralized. For example, a processor power management unit (p-unit), near memory controller (NMC), and/or far memory host controller (FMHC) makes decisions about the power and/or performance state of the FM at their respective levels. These decisions are coordinated to provide the most optimum power and/or performance state of the FM for a given time. The power and/or performance state of the memories adaptively change to changing workloads and other parameters even when the processor(s) is in a particular power state.

In some embodiments, a hardware and software coordinated processor power state policy (e.g., policy for C-state) is implemented that delivers optimal power state selection by taking in to account the performance and/or responsiveness needs of thread expected to be scheduled on the core entering idle, to achieve improved instructions per cycle (IPC) and performance for cores running user critical tasks. The scheme provides the ability to deliver responsiveness gains for important and/or user-critical threads running on a system-on-chip. P-unit 5510 which coupled to the plurality of processing cores, receives a hint from operating system 5552 indicative of a bias towards a power state or performance state for at least one of the processing cores of the plurality of processing cores based on a priority of a thread in context switch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example, of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right.," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies. Each processor may also be a dielet or chiplet. Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect.

An interface may include logic and I/O driver/receiver to send and receive data over the interconnect or one or more wires.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to as an Autonomous Perimeter (AP). A domain can be an entire system-on-chip (SoC) or part of the SoC, and is governed by a p-unit.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, device latency, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Various embodiments are described as examples. The examples can be combined in any suitable manner For instance, example 5 can be combined with example 3 and/or example 7.

Example 1: An apparatus comprising: a complex gate comprising an AND-OR-AND-INVERT logic gate to receive a data input and a scan input; and a plurality of NAND logic gates with shared n-type devices, wherein at least two NAND logic gates of the plurality of NAND logic gates is coupled to the complex gate, wherein the plurality of NAND logic gates includes a NAND gate to generate an output which is a sampled version of the data input or the scan input.

Example 2: The apparatus of example 1, comprises an inverter to generate the scan input.

Example 3: The apparatus of example 1, wherein the plurality of NAND logic gates includes a first NAND gate comprising a first input coupled to an output of the complex gate; and a second input coupled to a clock node.

Example 4: The apparatus of example 3, wherein the complex gate includes a second NAND gate that provides the output of the complex gate.

Example 5: The apparatus of example 4, wherein the second NAND gate comprises a first input coupled to an output of the first NAND gate; and a second input coupled to an output of an AND-OR gate of the complex gate.

Example 6: The apparatus of example 5, wherein the plurality of NAND logic gates includes a third NAND gate having a first input coupled to an output of the first NAND gate; and a second input coupled to an output of a fourth NAND gate, wherein an output of the third NAND gate is an inverse of the output which is the sampled version of the data input or the scan input.

Example 7: The apparatus of example 6, wherein the plurality of NAND logic gates includes a fifth NAND gate having a first include coupled to the clock node; and a second input coupled to an output of a sixth NAND gate, wherein output of the fifth NAND gate is coupled to first input of the fourth NAND gate, wherein an output of the third NAND gate is coupled to a second input of the fourth NAND gate, wherein an output of the fourth NAND gate is the output which is the sampled version of the data input or the scan input.

Example 8: The apparatus of example 7, wherein the sixth NAND gate has a first input coupled to an output of the complex gate, and a second input coupled an output of the fifth NAND gate.

Example 9: The apparatus of example 8, wherein the plurality of NAND logic gates includes seventh NAND gate having a first input coupled to the output of the third NAND gate; and a second input coupled to an output of the fifth NAND gate, wherein an output of the seventh NAND gate is the output which is the sampled version of the data input or the scan input.

Example 10: An apparatus comprising: a complex gate to receive a data input and a scan input; and a plurality of NAND logic gates with shared n-type devices, wherein at least some of the plurality of NAND logic gates are connected as set-reset latches, wherein at least one NAND gate of the plurality of NAND logic gates is coupled to an output of the complex gate.

Example 11: The apparatus of example 10, wherein the complex gate comprises AND-OR-AND-INVERT logic gate.

Example 12: The apparatus of example 10, comprises an inverter to generate the scan input.

Example 13: The apparatus of example 12, wherein the plurality of NAND logic gates includes a first NAND gate comprising a first input coupled to an output of the complex gate; and a second input coupled to clock node.

Example 14: The apparatus of example 13, wherein the complex gate includes a second NAND gate that provides the output of the complex gate.

Example 15: A system comprising: a memory to store one or more instructions; a processor circuitry to execute the one or more instructions, wherein the processor circuitry is coupled to the memory; and a communication interface to allow the processor circuitry to communicate with another device, wherein the processor circuitry includes a flip-flop which comprises: a complex gate comprising an AND-OR-AND-INVERT logic gate to receive a data input and a scan input; and a plurality of NAND logic gates with shared n-type devices, wherein at least two NAND logic gates of the plurality of NAND logic gates is coupled to the complex gate, wherein the plurality of NAND logic gates includes a NAND gate to generate an output which is a sampled version of the data input or the scan input.

Example 16: The system of example 15, comprises an inverter to generate the scan input.

Example 17: The system of example 15, wherein the plurality of NAND logic gates includes a first NAND gate comprising a first input coupled to an output of the complex gate; and a second input coupled to clock node.

Example 18: The system of example 17, wherein the complex gate includes a second NAND gate that provides the output of the complex gate.

Example 19: The system of example 18, wherein the second NAND gate comprises a first input coupled to an output of the first NAND gate; and a second input coupled to an output of an AND-OR gate of the complex gate.

Example 20: The system of example 19, wherein the plurality of NAND logic gates includes a third NAND gate having a first input coupled to an output of the first NAND gate; and a second input coupled to an output of a fourth NAND gate, wherein an output of the third NAND gate is an inverse of the output which is the sampled version of the data input or the scan input.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a complex gate comprising an AND-OR-AND-INVERT logic gate to receive a data input and a scan input; and
   a plurality of NAND logic gates with shared n-type devices, wherein at least two NAND logic gates of the plurality of NAND logic gates is coupled to the complex gate, wherein the plurality of NAND logic gates includes a NAND gate to generate an output which is a sampled version of the data input or the scan input.

2. The apparatus of claim 1, comprises an inverter to generate the scan input.

3. The apparatus of claim 1, wherein the plurality of NAND logic gates includes a first NAND gate comprising a first input coupled to an output of the complex gate; and a second input coupled to a clock node.

4. The apparatus of claim 3, wherein the complex gate includes a second NAND gate that provides the output of the complex gate.

5. The apparatus of claim 4, wherein the second NAND gate comprises a first input coupled to an output of the first NAND gate; and a second input coupled to an output of an AND-OR gate of the complex gate.

6. The apparatus of claim 5, wherein the plurality of NAND logic gates includes a third NAND gate having a first input coupled to an output of the first NAND gate; and a second input coupled to an output of a fourth NAND gate, wherein an output of the third NAND gate is an inverse of the output which is the sampled version of the data input or the scan input.

7. The apparatus of claim 6, wherein the plurality of NAND logic gates includes a fifth NAND gate having a first include coupled to the clock node; and a second input coupled to an output of a sixth NAND gate, wherein output of the fifth NAND gate is coupled to first input of the fourth NAND gate, wherein an output of the third NAND gate is coupled to a second input of the fourth NAND gate, wherein an output of the fourth NAND gate is the output which is the sampled version of the data input or the scan input.

8. The apparatus of claim 7, wherein the sixth NAND gate has a first input coupled to an output of the complex gate, and a second input coupled an output of the fifth NAND gate.

9. The apparatus of claim 8, wherein the plurality of NAND logic gates includes seventh NAND gate having a first input coupled to the output of the third NAND gate; and a second input coupled to an output of the fifth NAND gate, wherein an output of the seventh NAND gate is the output which is the sampled version of the data input or the scan input.

10. An apparatus comprising:
    a complex gate to receive a data input and a scan input; and
    a plurality of NAND logic gates with shared n-type devices, wherein at least some of the plurality of NAND logic gates are connected as set-reset latches, wherein at least one NAND gate of the plurality of NAND logic gates is coupled to an output of the complex gate.

11. The apparatus of claim 10, wherein the complex gate comprises AND-OR-AND-INVERT logic gate.

12. The apparatus of claim 10, comprises an inverter to generate the scan input.

13. The apparatus of claim 12, wherein the plurality of NAND logic gates includes a first NAND gate comprising a first input coupled to an output of the complex gate; and a second input coupled to clock node.

14. The apparatus of claim 13, wherein the complex gate includes a second NAND gate that provides the output of the complex gate.

15. A system comprising:

a memory to store one or more instructions;

a processor circuitry to execute the one or more instructions, wherein the processor circuitry is coupled to the memory; and a communication interface to allow the processor circuitry to communicate with another device, wherein the processor circuitry includes a flip-flop which comprises:

a complex gate comprising an AND-OR-AND-INVERT logic gate to receive a data input and a scan input; and a plurality of NAND logic gates with shared n-type devices, wherein at least two NAND logic gates of the plurality of NAND logic gates is coupled to the complex gate, wherein the plurality of NAND logic gates includes a NAND gate to generate an output which is a sampled version of the data input or the scan input.

16. The system of claim 15, comprises an inverter to generate the scan input.

17. The system of claim 15, wherein the plurality of NAND logic gates includes a first NAND gate comprising a first input coupled to an output of the complex gate; and a second input coupled to clock node.

18. The system of claim 17, wherein the complex gate includes a second NAND gate that provides the output of the complex gate.

19. The system of claim 18, wherein the second NAND gate comprises a first input coupled to an output of the first NAND gate; and a second input coupled to an output of an AND-OR gate of the complex gate.

20. The system of claim 19, wherein the plurality of NAND logic gates includes a third NAND gate having a first input coupled to an output of the first NAND gate; and a second input coupled to an output of a fourth NAND gate, wherein an output of the third NAND gate is an inverse of the output which is the sampled version of the data input or the scan input.

* * * * *